(12) United States Patent
Hu et al.

(10) Patent No.: US 10,663,794 B2
(45) Date of Patent: May 26, 2020

(54) DISPLAY DEVICES

(71) Applicant: InnoLux Corporation, Miao-Li County (TW)

(72) Inventors: Shun-Yuan Hu, Miao-Li County (TW); Ming-I Chao, Miao-Li County (TW); Yang-Chen Chen, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 36 days.

(21) Appl. No.: 15/968,895

(22) Filed: May 2, 2018

(65) Prior Publication Data

US 2018/0321558 A1 Nov. 8, 2018

Related U.S. Application Data

(60) Provisional application No. 62/500,539, filed on May 3, 2017.

(30) Foreign Application Priority Data

Nov. 10, 2017 (CN) .......................... 2017 1 1104263

(51) Int. Cl.
*G02F 1/1335* (2006.01)
*H01L 25/075* (2006.01)
*H01L 27/12* (2006.01)
*G02F 1/13357* (2006.01)
*H01L 33/50* (2010.01)
*H01L 33/60* (2010.01)
*H01L 33/62* (2010.01)
*H01L 33/58* (2010.01)

(52) U.S. Cl.
CPC .. *G02F 1/133603* (2013.01); *G02F 1/133605* (2013.01); *H01L 25/0753* (2013.01); *H01L 27/1214* (2013.01); *G02F 2001/133614* (2013.01); *G02F 2201/307* (2013.01); *G02F 2202/36* (2013.01); *H01L 33/502* (2013.01); *H01L 33/58* (2013.01); *H01L 33/60* (2013.01); *H01L 33/62* (2013.01)

(58) Field of Classification Search
CPC ......... G02F 1/133603; G02F 1/133605; H01L 25/0753; H01L 27/1214
See application file for complete search history.

(56) References Cited

U.S. PATENT DOCUMENTS 5,952,681 A * 9/1999 Chen .................... H01L 27/153
257/88
2018/0247922 A1* 8/2018 Robin .................. H01L 25/167

* cited by examiner

*Primary Examiner* — Anh T Mai
*Assistant Examiner* — Nathaniel J Lee
(74) *Attorney, Agent, or Firm* — McClure, Qualey & Rodack, LLP

(57) ABSTRACT

A display device is provided. The display device includes a mother substrate for light-emitting units. The mother substrate for light-emitting units has a first upper surface and a first lower surface. The display device also includes at least one light-emitting unit disposed on the first lower surface, and a first substrate having a second upper surface, a second lower surface, and a plurality of active devices disposed between the second upper surface and the second lower surface. The light-emitting unit is electrically connected with at least one of the active devices of the first substrate.

17 Claims, 14 Drawing Sheets

DISPLAY DEVICES

CROSS REFERENCE TO RELATED APPLICATIONS

This application claims priority of provisional applications of U.S. Patent Application No. 62/500,539 filed on May 3, 2017, and China Patent Application No. 201711104263.7 filed on Nov. 10, 2017, the entirety of which are incorporated by reference herein.

BACKGROUND

Technical Field

The disclosure relates to display devices, and in particular to display devices that include light-emitting diodes.

Description of the Related Art

As digital technology develops, display devices are becoming more widely used in our society. For example, display devices have been applied in modern information and communication devices such as televisions, notebooks, computers, and mobile phones (e.g., smartphones). In addition, each generation of display devices has been developed to be thinner, lighter, smaller, and more fashionable than the previous generation.

Among the various types of display devices available, light-emitting diode (LED) display devices are gaining in popularity, since LEDs have such advantages as high efficiency and a long life span.

However, existing LED display devices have not been satisfactory in every respect. For example, the thickness of the LED backlight unit (or backlight module) is too great to facilitate the slimness and miniaturization of the device.

BRIEF SUMMARY

Some embodiments of the disclosure provide a display device. The display device includes a mother substrate for light-emitting units. The mother substrate for light-emitting units has a first upper surface and a first lower surface. The display device also includes at least one light-emitting unit disposed on the first lower surface, and a first substrate having a second upper surface, a second lower surface, and a plurality of active devices disposed between the second upper surface and the second lower surface. The light-emitting unit is electrically connected with at least one of the active devices of the first substrate.

A detailed description is given in the following embodiments with reference to the accompanying drawings.

BRIEF DESCRIPTION OF THE DRAWINGS

The disclosure can be more fully understood from the following detailed description when read with the accompanying figures. It is worth noting that in accordance with standard practice in the industry, various features are not drawn to scale. In fact, the dimensions of the various features may be arbitrarily increased or reduced for clarity of discussion.

DETAILED DESCRIPTION

Figure 1A:
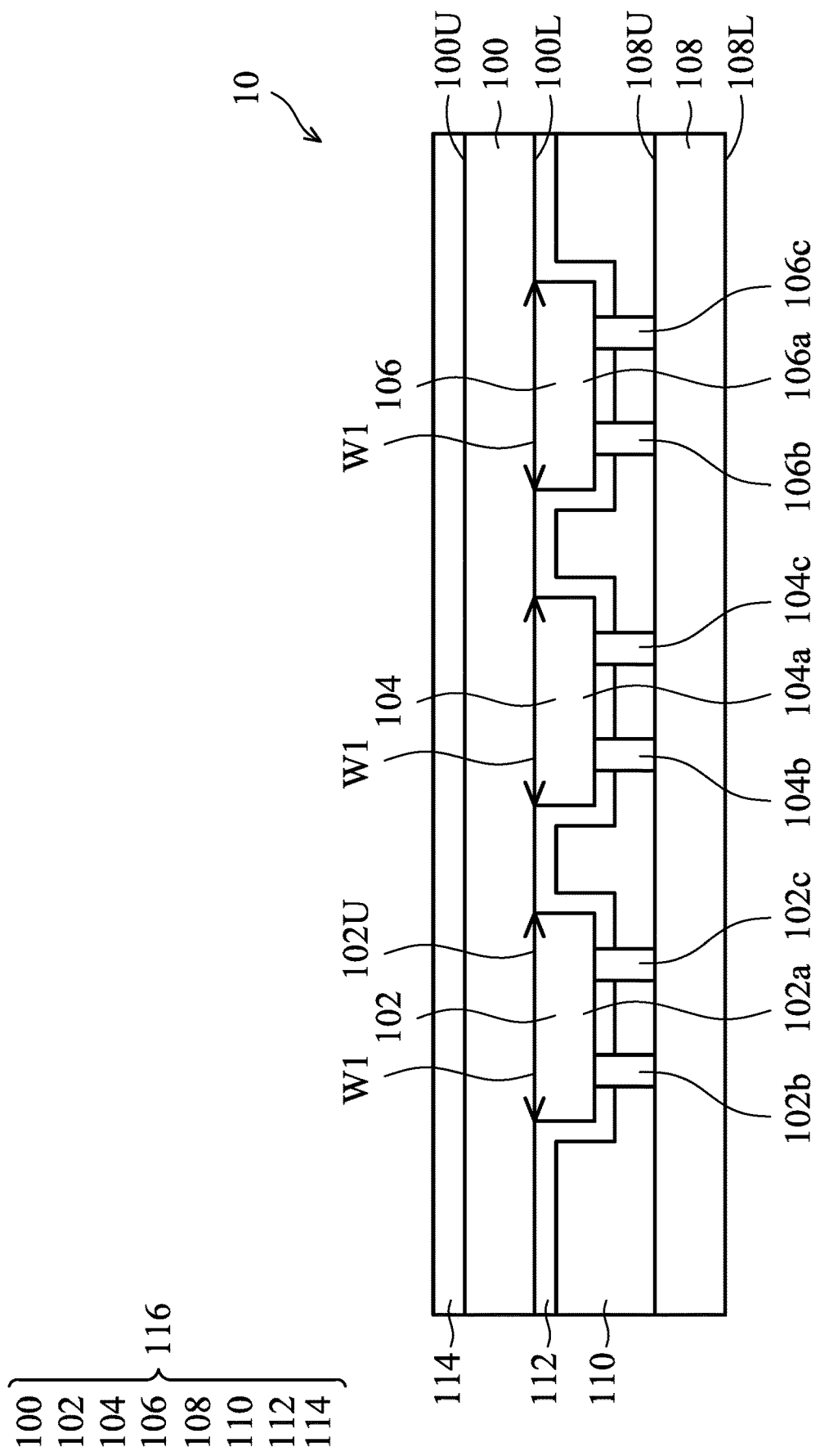
FIG. 1A is a partial cross-sectional view of the backlight unit 116 of the display device 10 according to Embodiment 1 of the present disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various embodiments. This repetition is for simplicity and clarity and does not in itself dictate a relationship between the various embodiments and/or configurations discussed.

Embodiment 1

The backlight unit 116 of the display device 10 of Embodiment 1 includes a mother substrate 100 for light-emitting units. The mother substrate 100 for light-emitting units may serve as the light guide plate of the backlight unit 116. Therefore, no additional light guide plate is needed, and thus the thickness of the display device 10 may be reduced.

FIG. 1A illustrates a partial cross-sectional view of the backlight unit 116 of the display device 10 of Embodiment 1 of the present disclosure. As shown in FIG. 1A, the display device 10 includes the mother substrate 100 for light-emitting units, and the mother substrate 100 for light-emitting units has a first upper surface 100U and a first lower surface 100L which are opposite to each other. One or more light-emitting units (e.g., the light-emitting unit 102, the light-emitting unit 104, or the light-emitting unit 106) are disposed on the first lower surface 100L of the mother substrate 100 for light-emitting units. In some embodiments, the thickness of the mother substrate 100 for light-emitting units may be smaller than the thickness of the exiting light guide plate. For example, when the mother substrate 100 for light-emitting units has a light-emitting unit disposed thereon and does not include a driving circuit, the total thickness of the light-emitting unit and the mother substrate 100 for light-emitting units may be in a range between 50 μm and 300 μm. For example, when the mother substrate 100 for light-emitting units has a light-emitting unit disposed thereon and includes a driving circuit, the total thickness of the light-emitting unit and the mother substrate 100 for light-emitting units may be in a range between 150 μm and 800 μm.

In this embodiment, the mother substrate 100 for light-emitting units is an epitaxial growth substrate (e.g., a sapphire substrate), and the light-emitting unit 102, the light-emitting unit 104, and the light-emitting unit 106 are light-emitting diodes. For example, the light-emitting unit 102, the light-emitting unit 104, and the light-emitting unit 106 (e.g., blue light-emitting diodes) may be formed on the first lower surface 100L of the mother substrate 100 for light-emitting units (e.g., a sapphire substrate) by an epitaxial growth process, such as molecular-beam epitaxy (MBE) process, metalorganic chemical vapor deposition (MOCVD) process, hydride vapor phase epitaxy (HVPE) process, another applicable epitaxial growth process, or a combination thereof. In other words, the light-emitting unit 102, the light-emitting unit 104, or the light-emitting unit 106 may be disposed on the first lower surface 100L of the mother substrate 100 for light-emitting units without additional bonding process, and thus the manufacturing cost of the display device 10 may be reduced. In addition, the mother substrate 100 for light-emitting units may serve as the light guide plate of the display device 10, and thus the thickness of the display device 10 may be reduced.

In some embodiments, after the light-emitting unit 102, the light-emitting unit 104, and the light-emitting unit 106 (e.g., blue light-emitting diodes) are formed on the first lower surface 100L of the mother substrate 100 for light-emitting units (e.g., a sapphire substrate) by the epitaxial growth process discussed above, an applicable process (e.g., a grinding process, an etching process, or a combination thereof) may be performed on a side of the mother substrate 100 for light-emitting units opposite to the light-emitting units 102, 104 and 106 to remove a portion of the mother substrate 100 for light-emitting units, and thus the thickness of the mother substrate 100 for light-emitting units can be reduced.

In some other embodiments, the mother substrate 100 for light-emitting units may include SiC substrate, Si substrate, $MgAl_2O_4$ substrate, MgO substrate, $LiAlO_2$ substrate, $LiGaO_2$ substrate, GaN substrate, GaP substrate, InP substrate, Ge substrate, glass substrate, other applicable substrates, or a combination thereof, and the light-emitting units (e.g., light-emitting diodes 102, 104, and 106) may be bonded to the mother substrate 100 for light-emitting units by an applicable bonding process. For example, a eutectic bonding process or a glue bonding process may be used to bond the light-emitting units to the mother substrate 100 for light-emitting units.

In some embodiments, the refractive index of the mother substrate 100 for light-emitting units is less than 1.5, and thus it is hard for the total reflection of the light to occur in the mother substrate 100 for light-emitting units, resulting in poor light-guiding function. Therefore, in some other embodiments, the refractive index of the mother substrate 100 for light-emitting units is greater than, or equal to 1.5 (e.g., the refractive index being in a range between 1.5 and 10), and thus a better light-guiding function may be obtained. For example, the mother substrate 100 for light-emitting units used in this embodiments is a sapphire substrate of which the refractive index is greater than, or equal to 1.5.

For example, the light-emitting unit (e.g., the light-emitting unit 102, the light-emitting unit 104, and the light-emitting unit 106) may include a light-emitting body (e.g., the light-emitting body 102a, the light-emitting body 104a, and the light-emitting body 106a) and connection elements (e.g., connection elements 102b/102c, connection elements 104b/104c, and connection elements 106b/106c). In some embodiments, the light-emitting body may be made of semiconductor materials (e.g., GaN) and a multiple quantum well (MQW) structure, and the connection elements may include electrodes or conductive bumps. In some embodiments, the connection elements of a single light-emitting unit may have the same thickness (e.g., the thickness of the connection element 102b may be equal to the thickness of the connection element 102c). However, in some other embodiments, the thickness of each connection element of a single light-emitting unit may be different from each other.

In some embodiments, the light-emitting body of the light-emitting unit may have an upper surface away from the connection elements. For example, as shown in FIG. 1A, the light-emitting body 102a of the light-emitting unit 102 has an upper surface 102U away from the connection elements 102b/102c. In some embodiments, the upper surface of the light-emitting body of the light-emitting unit away from the connection elements (e.g., the upper surface 102U of the light-emitting unit 102) may serve as the light-emitting surface of the light-emitting unit.

As shown in FIG. 1A, the light-emitting unit (e.g., the light-emitting unit 102, the light-emitting unit 104, and the light-emitting unit 106) may have a width W1. In some embodiments, the width W1 is less than 10 μm, and thus the connection elements may be unable to form on the upper surface of the same substrate, and the manufacturing process may be relatively complicated. Therefore, in this embodiment, the width W1 is in a range between 10 μm and 1000 μm, so that the above problem resulting from the width W1 being too small may be avoided.

Still referring to FIG. 1A, the display device 10 includes a first substrate 108 having a second upper surface 108U and a second lower surface 108L opposite to each other, and the light-emitting unit 102, the light-emitting unit 104 and light-emitting unit 106 are disposed between the first lower surface 100L of the mother substrate 100 for light-emitting units and the second upper surface 108U of the first substrate 108. For example, the first substrate 108 may include one or more active devices (not shown in the figure) disposed between the second upper surface 108U and the second lower surface 108 L. For example, the active device may be a transistor. For example, the first substrate 108 may be a thin film transistor substrate (TFT substrate), and the thin film transistor substrate may include a transistor array made of a plurality of transistors.

In some embodiments, the one or more active devices may be electrically connected with the light-emitting units 102, 104 and 106. In some embodiments, the one or more active devices may control or adjust the driving signal (e.g., current signal) which is to be transmitted to the light-emitting units 102, 104 and 106, so that the brightness of the light-emitting units 102, 104 and 106 can be adjusted. In some embodiments, the light-emitting units 102, 104 and 106 may each connected to a different active device. In other words, the signals transmitted to the light-emitting units 102, 104 and 106 can be separately controlled through their own corresponding active device to achieve the purpose of local dimming control.

In some embodiments, the second upper surface 108U of the first substrate 108 may be provided with one or more bonding pads (not shown in the figure) made of conductive materials (e.g., metal, or metal alloy). For example, an applicable process (e.g., eutectic bonding process, anisotropic conductive film bonding process, or reflow process) may be used to bond the connection elements 102b/102c of the light-emitting unit 102, the connection elements 104b/104c of the light-emitting unit 104, and the connection elements 106b/106c of the light-emitting unit 106 to the bonding pads of the second upper surface 108U of the first substrate 108. In other words, the driving signals can be transmitted from one or more active devices in the first substrate 108 to the light-emitting bodies 102a, 104a and 106a via the bonding pads and the connection elements 102b/102c, 104b/104c and 106b/106c.

In some embodiments, as shown in FIG. 1A, the display device 10 may include a first insulating layer 110. The first insulating layer 110 may be used to protect the light-emitting units 102, 104 and 106. As shown in FIG. 1A, the first insulating layer 110 may be disposed between the mother substrate 100 for light-emitting units and the first substrate 108 and may be disposed around the light-emitting units 102, 104 and 106. For example, the first insulating layer 110 may include polyimide, silicon, epoxy, photoresist, other applicable materials, or a combination thereof. For example, the first insulating layer 110 may be formed by a spin-on coating process, a rolling process, a vacuum lamination process, a chemical vapor deposition process, a plasma-enhanced chemical vapor deposition process, another applicable process, or a combination thereof.

In some embodiments, the first insulating layer 110 may include a light curable material or a thermal curable material. Therefore, a precursor of the first insulating layer 110 may be formed on the second upper surface 108U of the first substrate 108, and then the mother substrate 100 for light-emitting units and the first substrate 108 are aligned and combined, and the light-emitting units 102, 104 and 106 are bonded to the first substrate 108. Then, a light curing process or a thermal curing process may be performed to cure the precursor of the first insulating layer 110 to form the first insulating layer 110 between the mother substrate 100 for light-emitting units and the first substrate 108. In some other embodiments, the precursor of the first insulating layer 110 may be formed on the light-emitting unit 102, the light-emitting unit 104, the light-emitting unit 106, and the first lower surface 100L of the mother substrate 100 for light-emitting units, and then the mother substrate 100 for light-emitting units is flipped over. Then, the mother substrate 100 for light-emitting units and the first substrate 108 are aligned and combined, and the light-emitting units 102, 104 and 106 are bonded to the first substrate 108. Then, a light curing process or a thermal curing process may be performed to cure the precursor of the first insulating layer 110 to form the first insulating layer 110 between the mother substrate 100 for light-emitting units and the first substrate 108.

Still referring to FIG. 1A, the display device may also include a reflection layer 112 disposed between the first lower surface 100L of the mother substrate 100 for light-emitting units and the first insulating layer 110. The reflection layer 112 may reflect the light back to the mother substrate 100 for light-emitting units, such that the light-emitting efficiency may be increased. For example, the reflection layer 112 may include polyethylene terephthalate, metals (e.g., Ag or Al), distributed Bragg reflector structure, Omni-directional reflector structure, adhesive containing highly reflective particles (e.g., $TiO_2$, or $BaSO_4$), other applicable materials and structures, or a combination thereof. In some embodiments, the light reflectance of the reflection layer 112 is in a range between 70% and 80%. For example, before the light-emitting units 102, 104 and 106 are bonded to the first substrate 108, a patterned reflection layer 112 may be formed on the first lower surface 100L of the mother substrate 100 for light-emitting units by an applicable process (e.g., a spin-on coating process, a sputtering process, or a lithography process). The connection elements 102b/102c, 104b/104c and 106b/106c of the light-emitting units 102, 104 and 106 may be exposed by the patterned reflection layer 112. In some embodiments where the reflection layer 112 includes conductive metals or other conductive materials, electrical insulation is provided between the reflection layer 112 and the connection elements (e.g., 102b/102c, 104b/104c and 106b/106c).

Still referring FIG. 1A, the display device may also include a wavelength conversion layer 114 disposed on the first upper surface 100U of the mother substrate 100 for light-emitting units. The wavelength conversion layer 114 may be used to change the wavelength of the light. In some embodiments, the light emitted by the light-emitting units 102, 104 and 106 is blue light, and the blue light may be converted into a light of a different wavelength (e.g., red light) through the wavelength conversion layer 114. For example, the wavelength conversion layer 114 may include fluorescence powders or phosphors disposed in glass or polymer, other applicable materials, or a combination thereof. In some embodiments, the fluorescence powders or phosphors may be quantum dot materials.

As shown in FIG. 1A, the mother substrate 100 for light-emitting units, the light-emitting units 102, 104 and 106, the first substrate 108, the first insulating layer 110, the reflection layer 112, and the wavelength conversion layer 114 may serve as the backlight unit 116 (or at least a portion of the backlight unit 116) of the display device 10. As discussed above, the backlight unit 116 includes the mother substrate 100 for light-emitting units to serve as the light guide plate, and thus no additional light guide plate is needed. Therefore, the thickness of the backlight unit 116 may be reduced, and thus the thickness of the display device 10 may also be reduced.

In some embodiments, two or more backlight units are combined to be laterally adjacent to each other, such that they can be used in large-sized display devices. For example, one or more light-emitting units may be formed on several mother substrates for light-emitting units by the process discussed above, and theses mother substrates for light-emitting units may be combined to be laterally adjacent to each other to be applied to a large-sized display device.

Figure 1B:
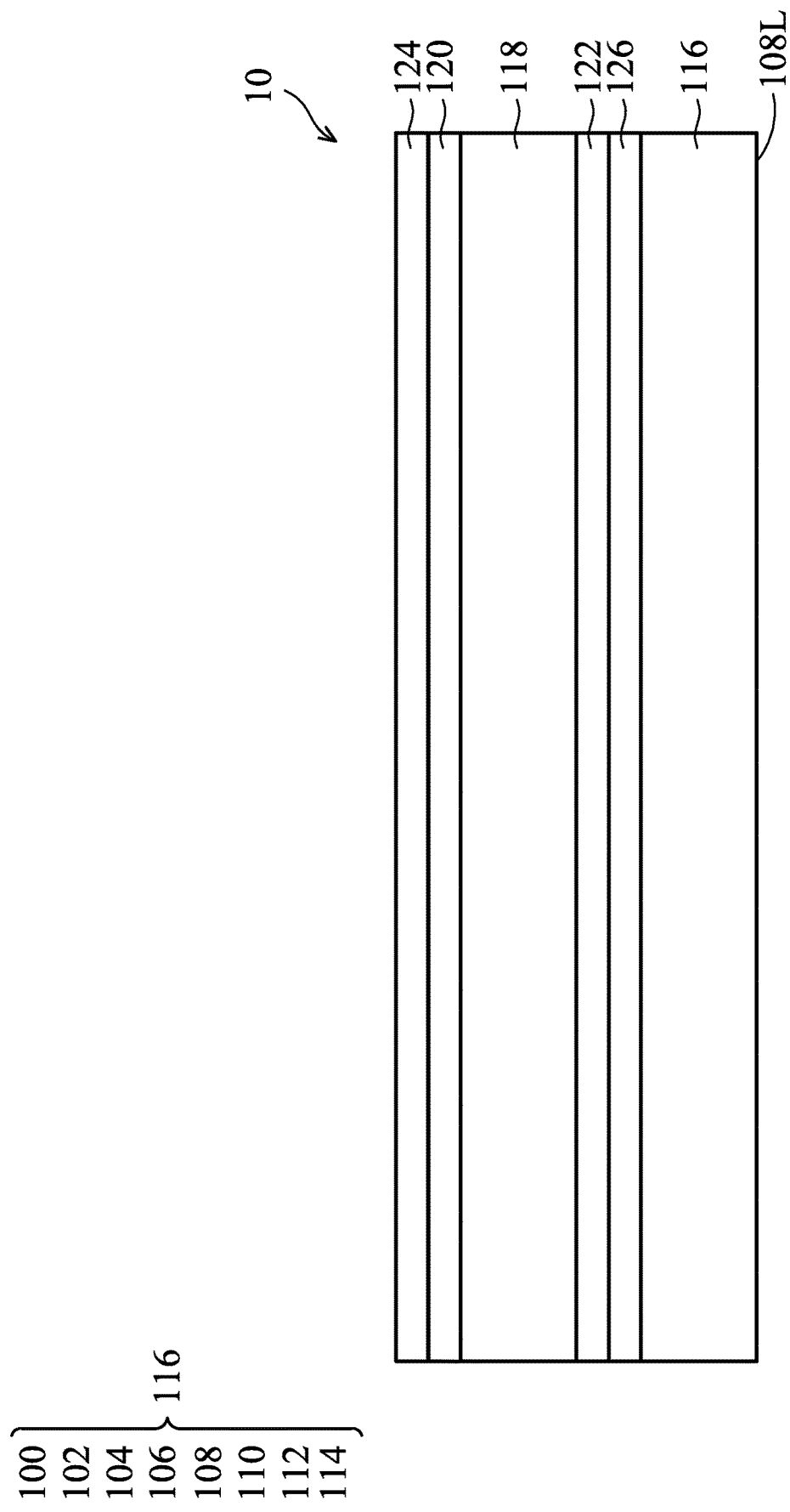
FIG. 1B is a partial cross-sectional view of the backlight unit 116 of the display device 10 according to some embodiments of the present disclosure.

The backlight unit 116 may be combined with other existing or future display elements to form a complete display device. For example, as shown in FIG. 1B, in some embodiments, the display device 10 may further include a liquid crystal layer 118, an upper substrate 120 and a lower substrate 122, an upper polarizing plate 124 and a lower polarizing plate 126, other applicable display elements, or a combination thereof. The liquid crystal layer 118 may be sandwiched by the substrates 120 and 122, and the liquid crystal layer 118 and the substrates 120 and 122 may be sandwiched by the polarizing plates 124 and 126. In some embodiments, the upper substrate 120 may be a TFT substrate including thin film transistors, and the lower substrate 122 may be color filter substrate including color filters.

Embodiment 2

One difference between Embodiment 1 and Embodiment 2 is that the backlight unit 216 of the display device 20 of Embodiment 2 includes light-emitting units of different colors. Therefore, the backlight unit 216 can include no wavelength conversion layer, and thus the thickness of the backlight unit 216 may be reduced further.

Figure 2:
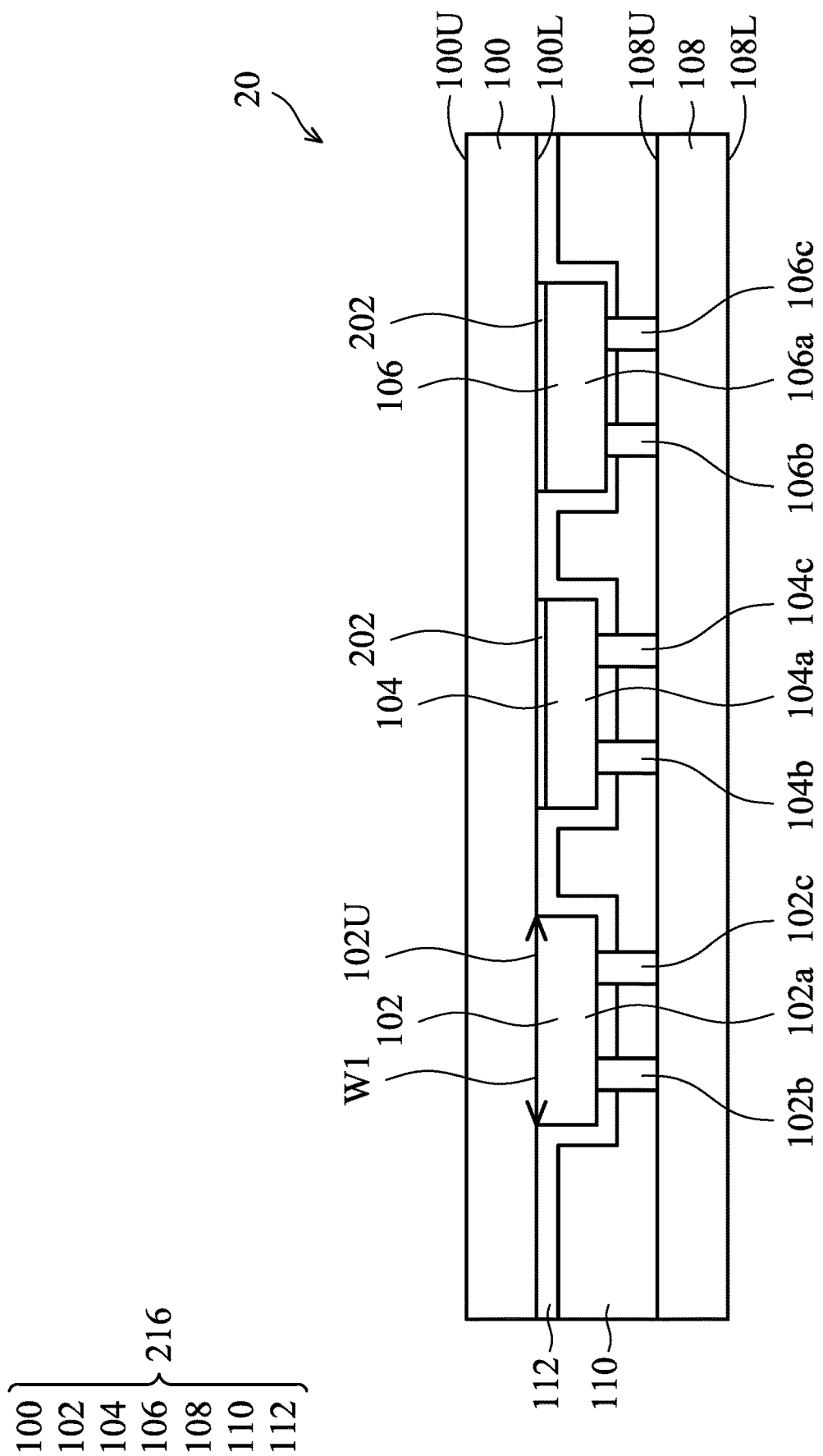
FIG. 2 is a partial cross-sectional view of the backlight unit 216 of the display device 20 according Embodiment 2 of the present disclosure.

FIG. 2 illustrates a partial cross-sectional view of the backlight unit 216 of the display device 20 of Embodiment 2 of the present disclosure. In this embodiment, the backlight unit 216 of the display device 20 includes light-emitting units 102, 104 and 16 which have different colors. For example, the light-emitting unit 102 may be a blue light-emitting diode, the light-emitting unit 104 may be a red light-emitting diode, and the light-emitting unit 106 may be a green light-emitting diode. In this embodiment, since the mother substrate 100 for light-emitting units is an epitaxial substrate for blue light-emitting diodes (e.g., a sapphire substrate), the blue light-emitting diode 102 may be formed directly on the first lower surface 100L of the mother substrate 100 for light-emitting units by an epitaxial process, and then the red light-emitting diode 104 and the green light-emitting diode 106 may be bonded to the first lower surface 100L of the mother substrate 100 for light-emitting units by one or more bonding processes.

As shown in FIG. 2, in this embodiment, the red light-emitting diode 104 and the green light-emitting diode 106 is bonded to the mother substrate 100 for light-emitting units through an adhesion layer 202. For example, the adhesion layer 202 may include anisotropic conductive film (ACF), transparent glue, another applicable material, or a combination thereof.

As shown in FIG. 2, the adhesion layer 202 has a certain thickness. Therefore, in some embodiments, the thickness of the light-emitting unit 104 and the thickness of the light-emitting unit 106 may be adjusted to be smaller than the thickness of the light-emitting unit 102 to maintain the same distance between the mother substrate 100 for light-emitting units and the first substrate 108. For example, the thickness of the light-emitting body 104a of the light-emitting unit 104 may be smaller than the thickness of the light-emitting body 102a of the light-emitting unit 102, or the thickness of the connection elements 106b/106c of the light-emitting unit 106 may be smaller than the thickness of the connection elements 102b/102c of the light-emitting unit 102.

It should be understood that although an epitaxial substrate for blue light-emitting diodes is used as an example of the mother substrate 100 for light-emitting units in this embodiment, the present disclosure is not limited thereto. For example, in some other embodiments, the mother substrate 100 for light-emitting units may include an epitaxial substrate for red light-emitting diodes (e.g., GaP substrate). In these embodiments, the red light-emitting diode may be formed directly on the first lower surface 100L of the mother substrate 100 for light-emitting units, and then the blue light-emitting diode and the green light-emitting diode may be bonded to the first lower surface 100L of the mother substrate 100 for light-emitting units through the adhesion layer 202. In other words, the mother substrate 100 for light-emitting units may be selected to perform an epitaxial process according to the properties of the light-emitting units 102, 104 and 106.

It should be noted that although they are not shown in the figure, the display device 20 may also include other display elements (e.g., a liquid crystal layer, a TFT substrate, or a color filter substrate as discussed in the above embodiments) disposed on the backlight unit 216.

Embodiment 3

One difference between Embodiment 3 and Embodiments 1-2 is that the backlight unit 316 of the display device 30 of Embodiment 3 further includes a patterned layer 302 disposed on the first upper surface 100U of the mother substrate 100 for light-emitting units to increase the light uniformity of the light emitted by the backlight unit 316.

Figure 3A:
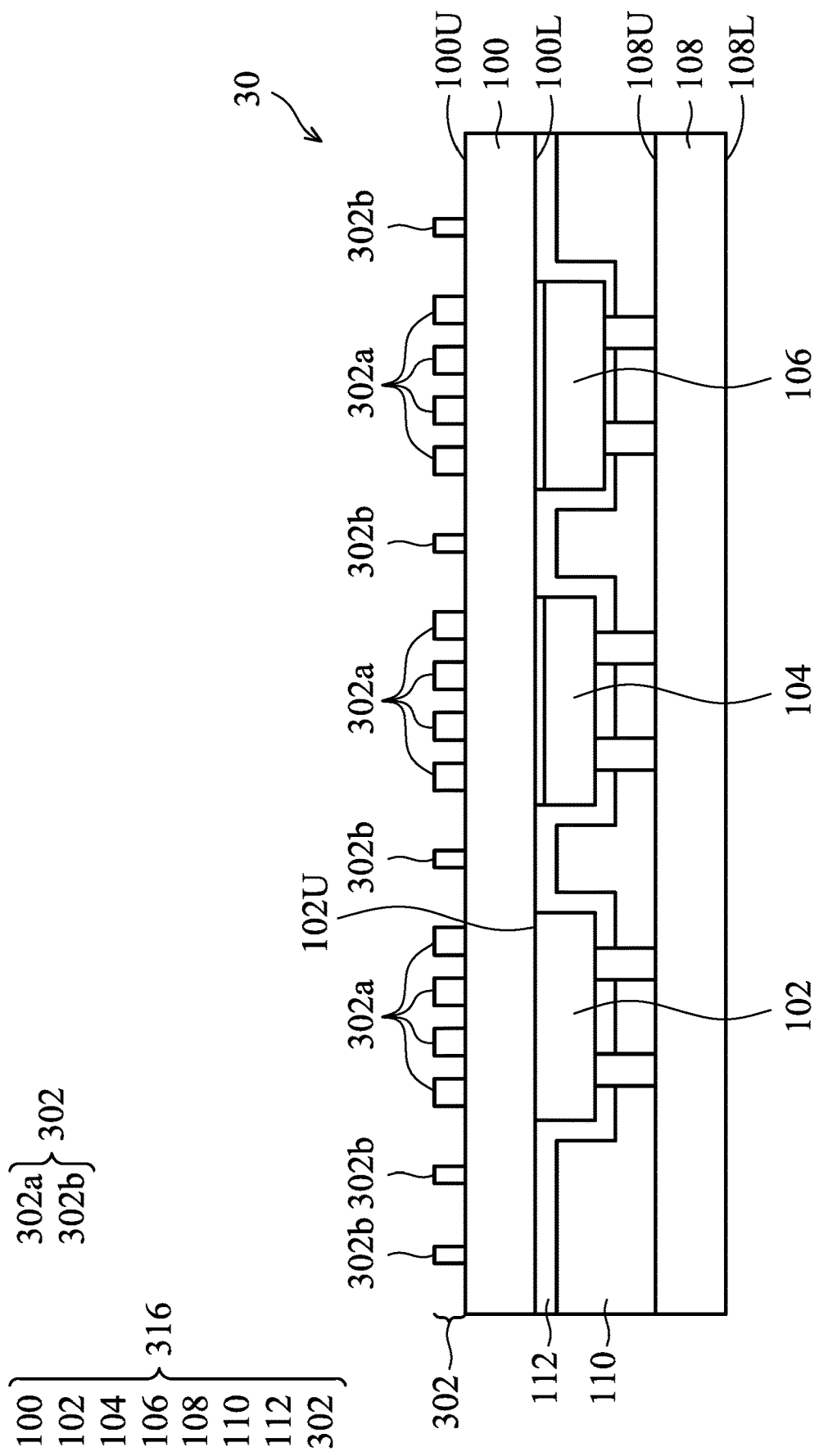
FIG. 3A is a partial cross-sectional view of the backlight unit 316 of the display device 30 according to Embodiment 3 of the present disclosure.

FIG. 3A illustrates a partial cross-sectional view of the backlight unit 316 of the display device 30 of Embodiment 3 of the present disclosure. As shown in FIG. 3A, the backlight unit 316 of the display device 30 further includes a patterned layer 302. In some embodiments, the patterned layer 302 may include ink, a metal (e.g., Al, Ag, $TiO_2$, $BaSO_4$, other metallic materials, or a combination thereof), distributed Bragg reflector (DBR), a transparent material (e.g., polyimide, silicon, epoxy, photoresist, other applicable transparent materials, or a combination thereof), other applicable materials, or a combination thereof. In some embodiments where the patterned layer 302 includes ink, the step for forming the patterned layer 302 may include a screen printing process, an inkjet process, an aerosol jet process, another applicable process, or a combination thereof.

In some embodiments, the patterned layer 302 may include a plurality of first patterns 302a and a plurality of second patterns 302b. As shown in FIG. 3A, in some embodiments, the first plurality of patterns 302a are disposed corresponding to the light-emitting surfaces of the light-emitting units (e.g., the light-emitting units 102, 104 and 106), and the second plurality of patterns 302b are disposed around the first plurality of patterns 302a (e.g., the second plurality of patterns 302b are not disposed corresponding to the light-emitting surfaces of the light-emitting units).

Figure 3B:
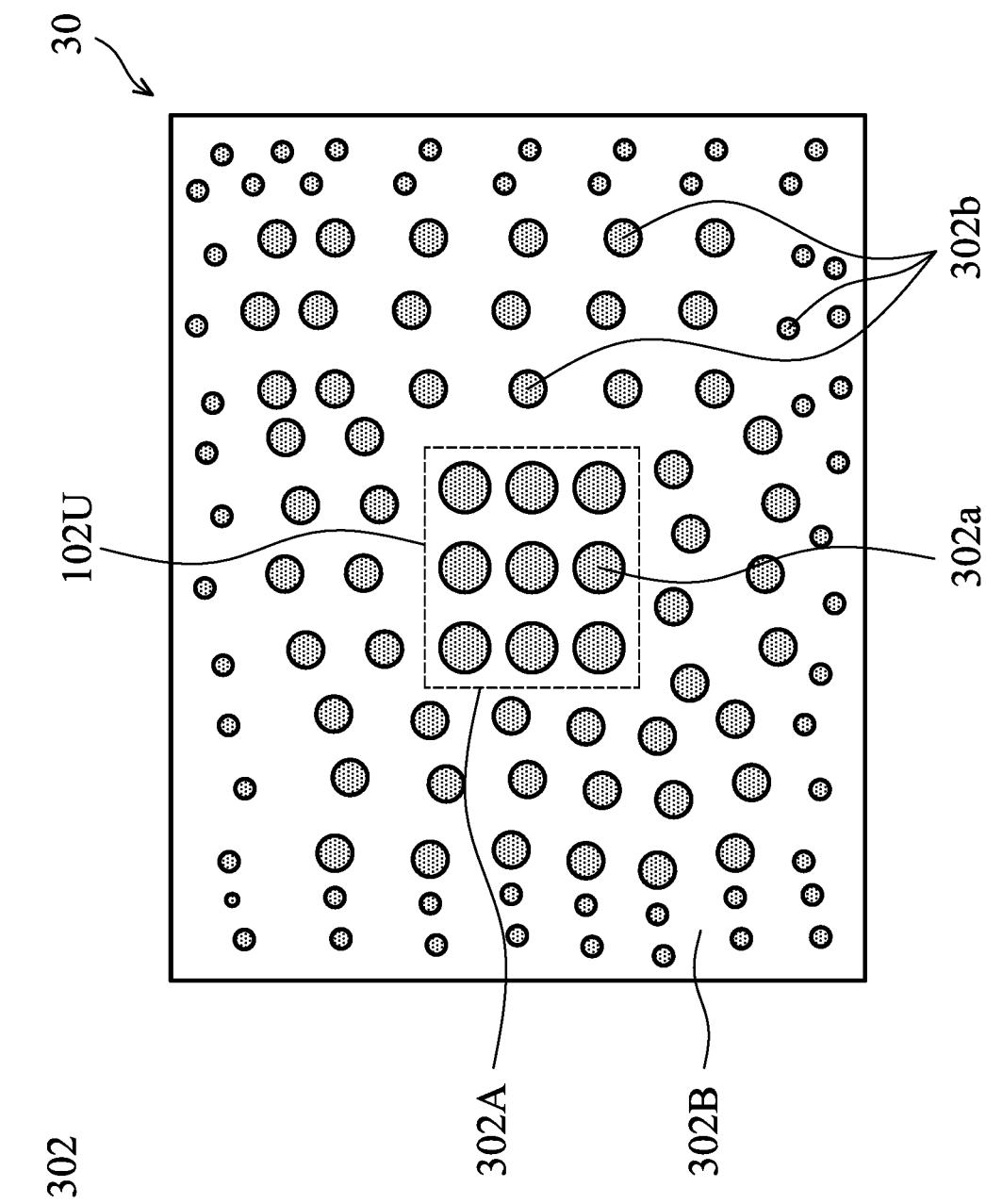
FIG. 3B illustrates a projection of the light-emitting unit and the patterned layer of the display device 30 onto the second upper surface of the first substrate according to Embodiment 3 of the present disclosure.

FIG. 3B illustrates the arrangement of the patterned layer 302 of the backlight unit 316 of the display device 30. In detail, FIG. 3 is a projection view of the light-emitting surface of the light-emitting unit and the patterned layer onto the second upper surface 108U of the first substrate 108. For the interest of clarity, only the light-emitting unit 102 is illustrated as an example in FIG. 3B. However, the arrangement may also be applied to other light-emitting units such as the light-emitting units 104 and 106.

As shown in FIG. 3B, the patterned layer 302 may include a first patterned region 302A and a second patterned region 302B disposed around the first patterned region 302A, the first patterned region 302A includes a plurality of first patterns 302a disposed corresponding to the light-emitting surface of the light-emitting unit 102, and the second patterned region 302B includes a plurality of second patterns 302b not disposed corresponding to the light-emitting surfaces of any light-emitting units. In other words, a region obtained by projecting the first patterned region 302A onto the second upper surface 108U of the first substrate 108 overlaps a region obtained by projecting the light-emitting surface 102U of the light-emitting unit 102 onto the second upper surface 108U of the first substrate 108, and a region obtained by projecting the second patterned region 302B onto the second upper surface 108U of the first substrate 108 does not overlap regions obtained by projecting the light-emitting surfaces of any light-emitting units onto the second upper surface 108U of the first substrate 108.

For example, the light transmittance of the first patterned region 302A may be different from the light transmittance of the second patterned region 302B. In some embodiments, the light transmittance of the first patterned region 302A is less than the light transmittance of the second patterned region 302B, so that the average light uniformity of the light emitted by the backlight unit 316 of the display device 30 may be improved.

In some embodiments, as shown in FIG. 3B, a dimension (i.e., an area) of one of the first plurality of patterns 302a may be greater than a dimension of one of the second plurality of patterns 302b. Further, in some embodiments, the dimension of each of the first plurality of patterns 302a is greater than the dimension of each of the second plurality of patterns 302b (i.e., the dimension of the smallest pattern of the first plurality of patterns 302a is greater than the dimension of the largest pattern of the second plurality of patterns 302b), and thus the light uniformity of the light emitted by the backlight unit 316 of the display device 30 may be improved.

Figure 3C:
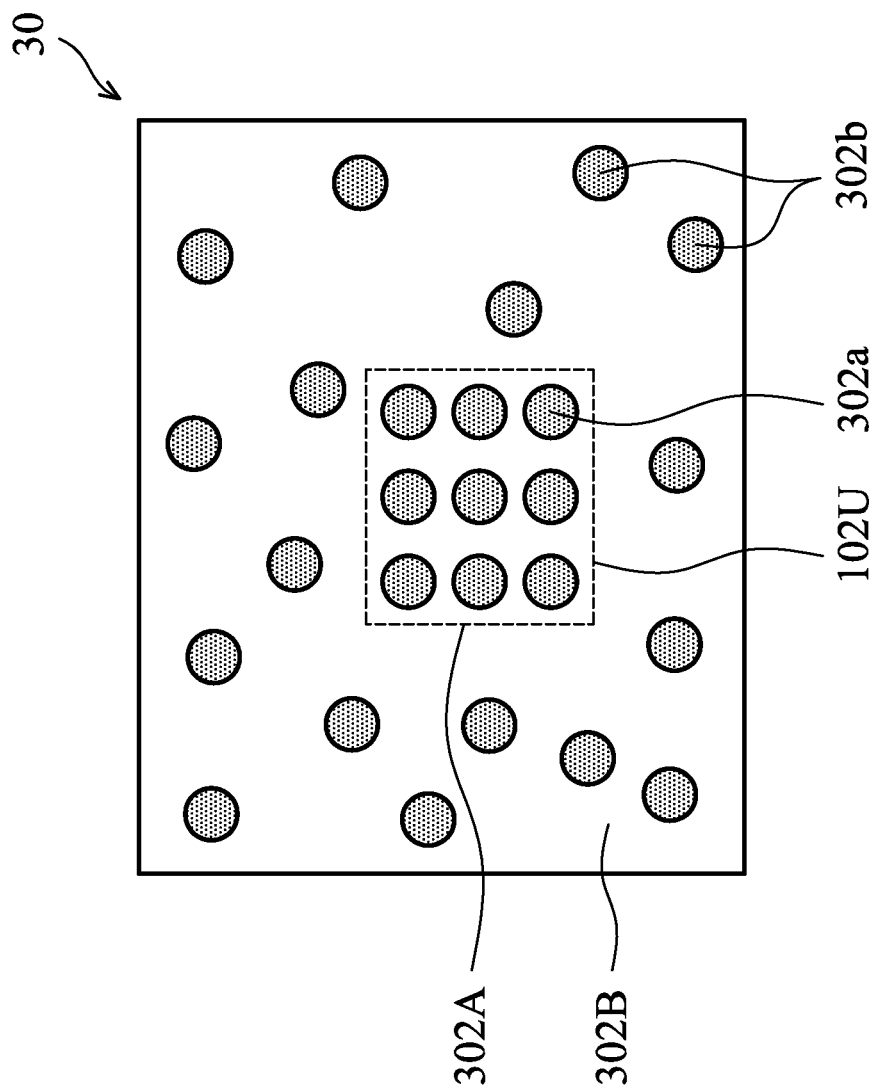
FIG. 3C illustrates a projection of the light-emitting unit and the patterned layer of the display device 30 onto the second upper surface of the first substrate according to some embodiments of the present disclosure.
Figure 3D:
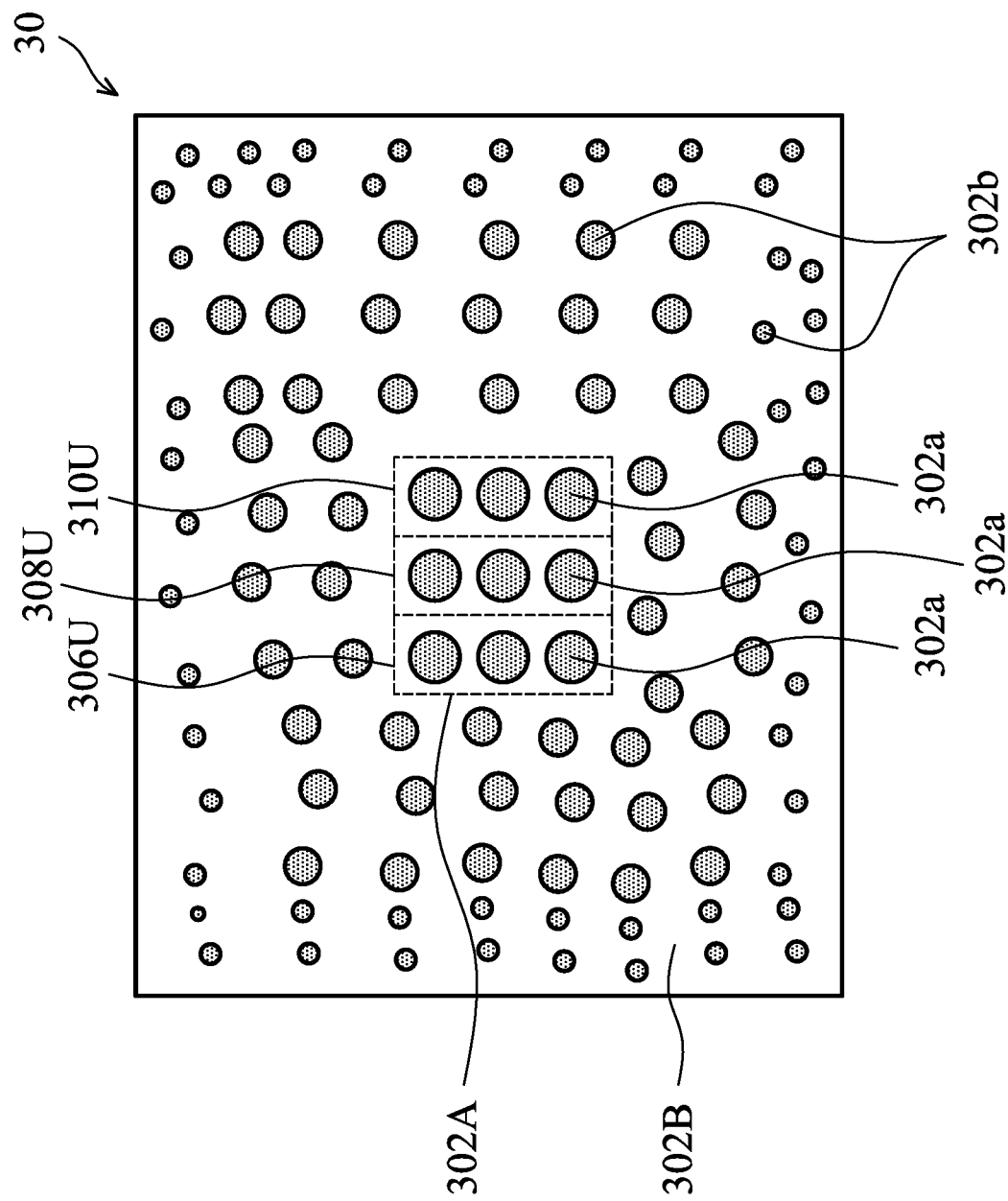
FIG. 3D illustrates a projection of the light-emitting unit and the patterned layer of the display device 30 onto the second upper surface of the first substrate according to some embodiments of the present disclosure.

In some embodiments, as shown in FIG. 3C, a dimension of one of the first plurality of patterns 302a is less than or equal to a dimension of one of the second plurality of patterns 302b, but a density (e.g., the number of patterns per unit area) of the first plurality of patterns 302a of the first patterned region 302A is greater than a density of the second plurality of patterns 302b of the second patterned region 302B. Therefore, the emitted light of the first patterned region 302A and the second patterned region 302B can still be adjusted and mixed to improve the light uniformity of the light emitted by the backlight unit 316 of the display device 30.

In some embodiments, the first plurality of patterns 302a of the first patterned region 302A is made of a material different from that of the second plurality of patterns 302b of the second patterned region 302B. In some embodiments, the first plurality of patterns 302a is made of a material with low light transmittance, and the second plurality of patterns 302b is made of a material with high light transmittance, so that the light uniformity of the light emitted by the backlight unit 316 of the display device 30 may be improved further. For example, the first plurality of patterns 302a may be made of a metal with low light transmittance (e.g., Al, Ag, other applicable metals, or a combination thereof) or a distributed Bragg reflector structure, and the forming process for the first plurality of patterns 302a may include a deposition process (e.g., an evaporation process or a sputtering process), a lithography process (e.g., photoresist coating (e.g., spin-on coating), soft baking, mask aligning, exposure, post-exposure, developing photoresist, rising, and drying (e.g., hard baking)), an etching process (e.g., a dry etching process or a wet etching process), other applicable processes, or a combination thereof. For example, the second plurality of patterns 302b may be made of a transparent material with a refractive index lower than the refractive index of the mother substrate 100 for light-emitting units (e.g., the second plurality of patterns 302b may be made of a transparent material with a refractive index less than 2.4), and the forming process for the second plurality of patterns 302b may include a spin-on coating process, a curing process (e.g., UV light curing process or thermal curing process), a lithography process, an etching process, other applicable processes, or a combination thereof. For example, the transparent material may include polyimide, silicon, epoxy, other applicable transparent materials (e.g., transparent photoresist), or a combination thereof.

It should be understood that although the first patterned region 302A of the patterned layer 302 of the above embodiments corresponds to a light-emitting surface of a single light-emitting unit (e.g., the light-emitting surface 102U of the light-emitting unit 102), the present disclosure is not limited thereto. In other embodiments, the first patterned region 302A of the patterned layer 302 may correspond to light-emitting surfaces of a plurality of light-emitting units. For example, in the embodiments illustrated in FIG. 3D, the first patterned region 302A of the patterned layer 302 corresponds to the light-emitting surfaces 306U, 308U, and 310 U of three light-emitting units adjacent to each other.

In some embodiments, the light-emitting surface 306U is the light-emitting surface of the blue light-emitting diode, the light-emitting surface 308U is the light-emitting surface of the green light-emitting diode, and the light-emitting surface 310U is the light-emitting surface of the red light-emitting diode. In some embodiments, the patterned layer corresponding to the light-emitting diodes of different colors may include different materials. In other words, the patterns 302a corresponding to the light-emitting surface 306U of the blue light-emitting diode, the patterns 302a corresponding to the light-emitting surface 308U of the green light-emitting diode, and the patterns 302a corresponding to the light-emitting surface 310U of the red light-emitting diode may be made of different materials, and thus the emitted lights of the light-emitting diodes of different colors can be adjusted and mixed to achieve better visual effects.

It should be understood that although the light-emitting surfaces of the light-emitting units of the above embodiments are substantially rectangular, the present disclosure is not limited thereto. For example, the light-emitting surfaces of the light-emitting units may also be substantially circular, oblong, triangular, polygonal, irregular-shaped, other applicable shapes, or a combination thereof. Similarly, although the patterns of the patterned layer of the above embodiments are substantially circular, the present disclosure is not limited thereto. For example, the patterns of the patterned layer may also be substantially rectangular, oblong, triangular, polygonal, irregular-shaped, other applicable shapes, or a combination thereof.

In should be noted that although they are not shown in the figure, the display device 30 may also include other display elements (e.g., a liquid crystal layer, a TFT substrate, or a color filter substrate as discussed above) disposed on the backlight unit 316.

Embodiment 4

In Embodiment 4, the patterned layer of the backlight unit 416 of the display device 40 includes several regions with different light transmittances, and thus the light uniformity of the light emitted by the backlight unit 416 of the display device 40 may be improved. For the interest of clarity, only the light-emitting unit 102 is taken as an example in the description of FIGS. 4A and 4B. However, the arrangement may also be applied to other light-emitting units such as the light-emitting units 104 and 106.

Figure 4A:
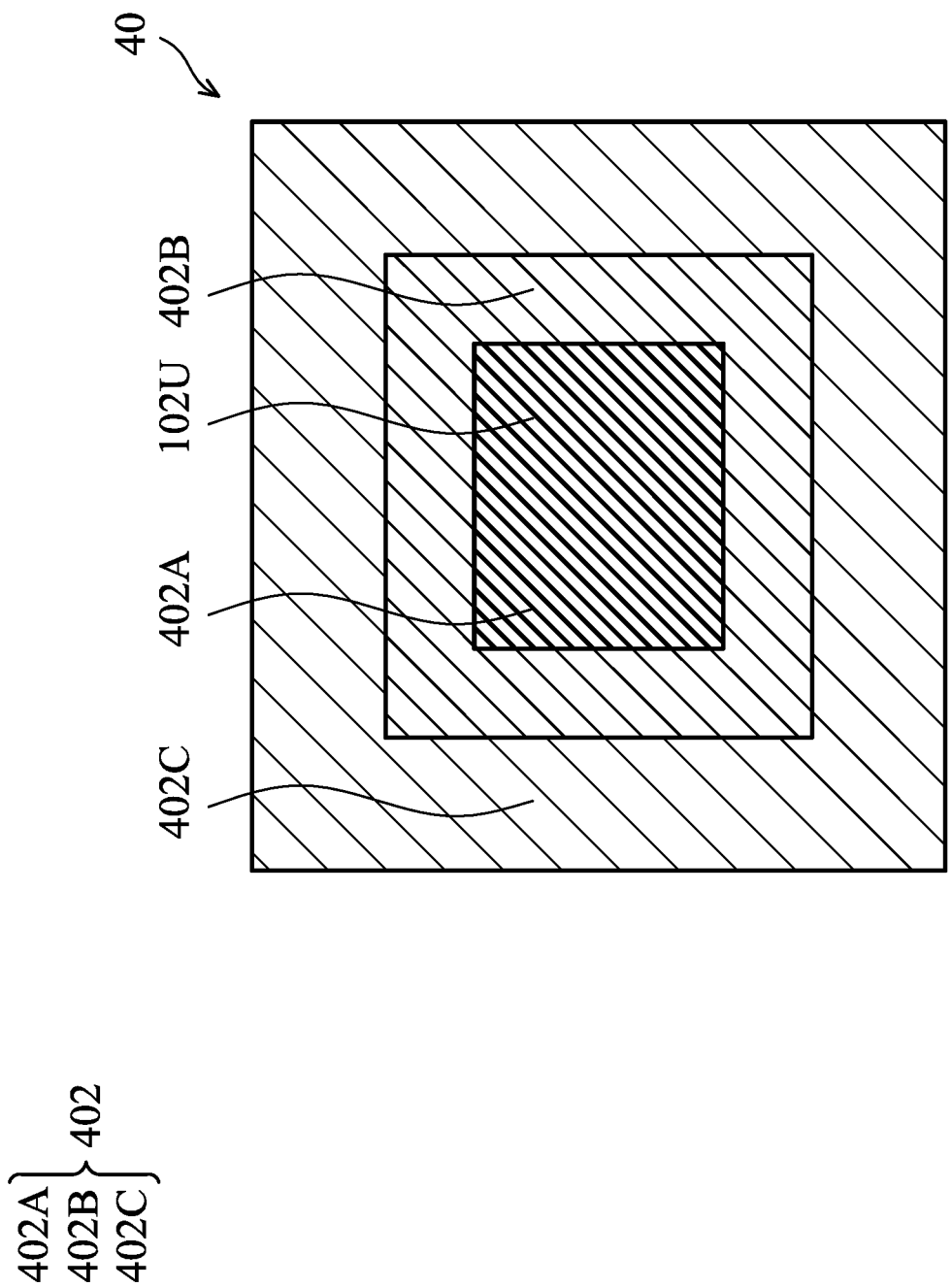
FIG. 4A illustrates a projection of the light-emitting unit and the patterned layer of the display device 40 onto the second upper surface of the first substrate according to Embodiment 4 of the present disclosure.

FIG. 4A illustrates the arrangement of the patterned layer 402 of the backlight unit 416 of the display device 40. In detail, FIG. 4A is a projection view obtained by projecting the light-emitting surface of the light-emitting unit and the patterned layer 402 onto the second upper surface 108U of the first substrate 108.

As shown in FIG. 4A, the patterned layer 402 may include a first patterned region 402A, a second patterned region 402B disposed around the first patterned region 402A, and a third patterned region 402C disposed around the second patterned region 402B. The first patterned region 402A is disposed corresponding to the light-emitting unit 102, and the second patterned region 402B and the third patterned region 402C are not disposed corresponding to any light-emitting units. In other words, a region obtained by projecting the first patterned region 402A onto the second upper surface 108U of the first substrate 108 overlaps a region obtained by projecting the light-emitting surface 102U of the light-emitting unit 102 onto the second upper surface 108U of the first substrate 108, and regions obtained by projecting the second patterned region 402B and the third patterned region 402C onto the second upper surface 108U of the first substrate 108 do not overlap regions obtained by projecting the light-emitting surfaces of any light-emitting units onto the second upper surface 108U of the first substrate 108.

For example, the light transmittance of the first patterned region 402A, the light transmittance of the second patterned region 402B, and the light transmittance of the third patterned region 402C may be different from each other. In some embodiments, the light transmittance of the first patterned region 402A is less than the light transmittance of the second patterned region 402B, and the light transmittance of the second patterned region 402B is less than the light transmittance of the third patterned region 402C. In other words, the light transmittance of the region (e.g., the first patterned region 402A) of the patterned layer 402 corresponding to the light-emitting surface of the light-emitting unit (e.g., the light-emitting surface 102U of the light-emitting unit 102) is less than the light transmittances of the regions (e.g., the second patterned region 402B and the third patterned region 402C) of the patterned layer 402 not corresponding to the light-emitting surface of the light-emitting unit, and the light transmittances of the regions (e.g., the second patterned region 402B and the third patterned region 402C) of the patterned layer 402 not corresponding to the light-emitting surface of the light-emitting unit gradually increase in a direction away from the region (e.g., the first patterned region 402A) of the patterned layer 402 corresponding to the light-emitting surface of the light-emitting unit.

For example, the first patterned region 402A has the lowest light transmittance, the second patterned region 402B has the second lowest light transmittance, and the third patterned region 402C has the greatest light transmittance.

Figure 4B:
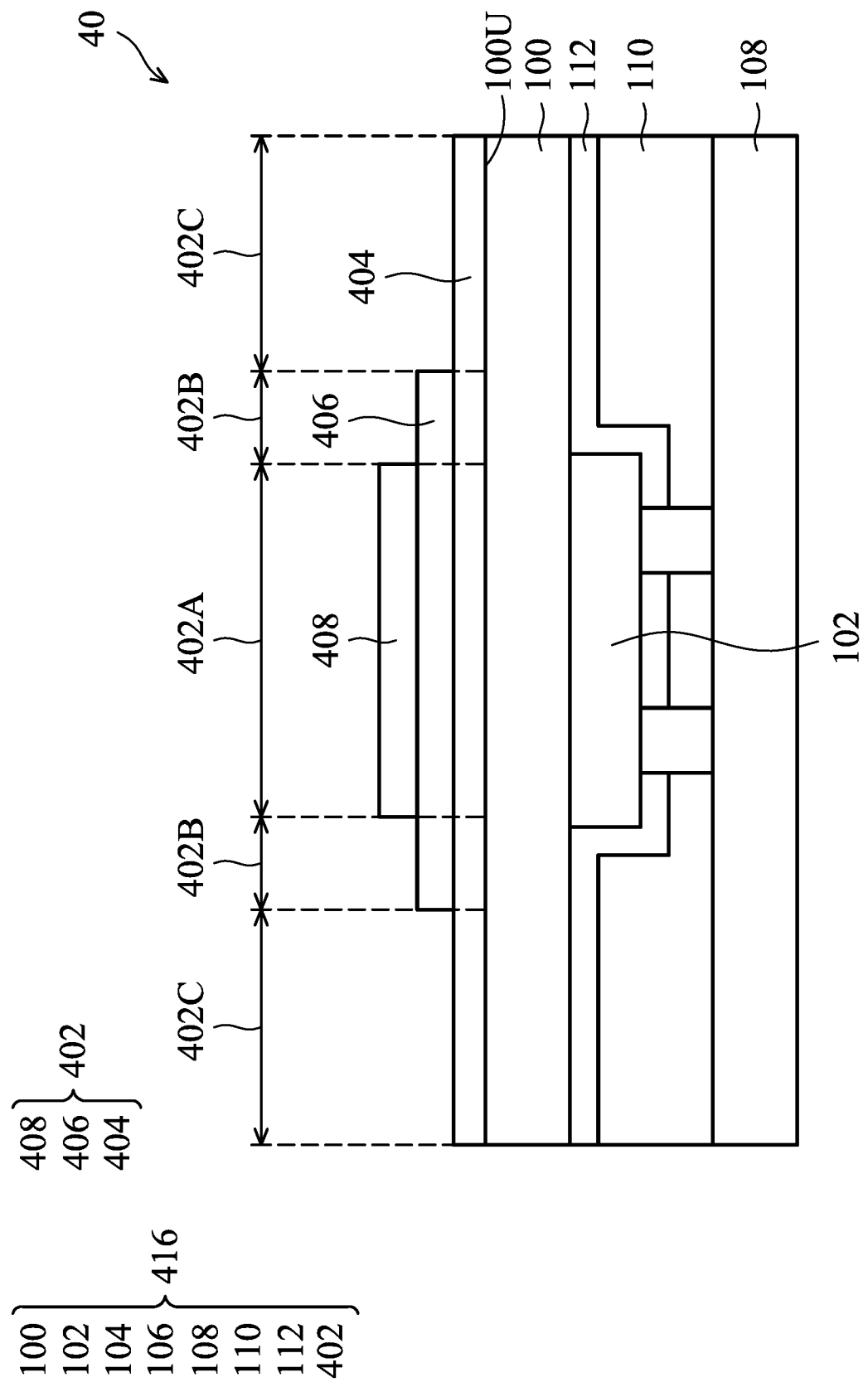
FIG. 4B is a partial cross-sectional view of the backlight unit 416 of the display device 40 according to Embodiment 4 of the present disclosure.

FIG. 4B is a partial cross-sectional view of the backlight unit 416 of the display device 40. As shown in FIG. 4B, the patterned layer 402 may include a plurality of sub-layers. For example, the patterned layer 402 may include a first sub-layer 404 on the first upper surface 100U of the mother substrate 100 for light-emitting units, a second sub-layer 406 on the first sub-layer 404, and a third sub-layer 408 on the second sub-layer 406. In some embodiments, the first sub-layer 404, the second sub-layer 406, and the third sub-layer 408 may be made of the same material, and the light transmittance difference between respective patterned regions (e.g., the first patterned region 402A, the second patterned region 402B, and the third patterned region 402C) may be adjusted and controlled by the thickness difference of the sub-layers. For example, as shown in FIG. 4B, the thickness of the first patterned region 402A of the patterned layer 402 is greater than the thickness of the second patterned region 402B of the patterned layer 402, and the thickness of the second patterned region 402B of the patterned layer 402 is greater than the thickness of the third patterned region 402C of the patterned layer 402.

In some embodiments, the material of the first sub-layer 404, the material of the second sub-layer 406, and the material of the third sub-layer 408 have the same light transmittance. For example, in these embodiments, the light transmittance of the stacked structure of the third sub-layer 408, the second sub-layer 406, and the first sub-layer 404 is less than the light transmittance of the stacked structure of the second sub-layer 406 and the first sub-layer 404, and the light transmittance of the stacked structure of the second sub-layer 406 and the first sub-layer 404 is less than the light transmittance of the first sub-layer 404.

In some other embodiments, the material of the first sub-layer 404, the material of the second sub-layer 406, and the material of the third sub-layer 408 may have different light transmittances from each other.

For example, the first sub-layer 404 may include indium tin oxide (ITO), titanium oxide ($TiO_x$), silicon oxide ($SiO_x$), silicon nitride (SiNx), other applicable materials, or a combination thereof, the second sub-layer 406 may include indium tin oxide (ITO), titanium oxide ($TiO_x$), silicon oxide ($SiO_x$), silicon nitride (SiNx), other applicable materials, or a combination thereof, and the third sub-layer 408 may include indium tin oxide (ITO), titanium oxide ($TiO_x$), silicon oxide ($SiO_x$), silicon nitride (SiNx), other applicable materials, or a combination thereof.

Figure 4C:
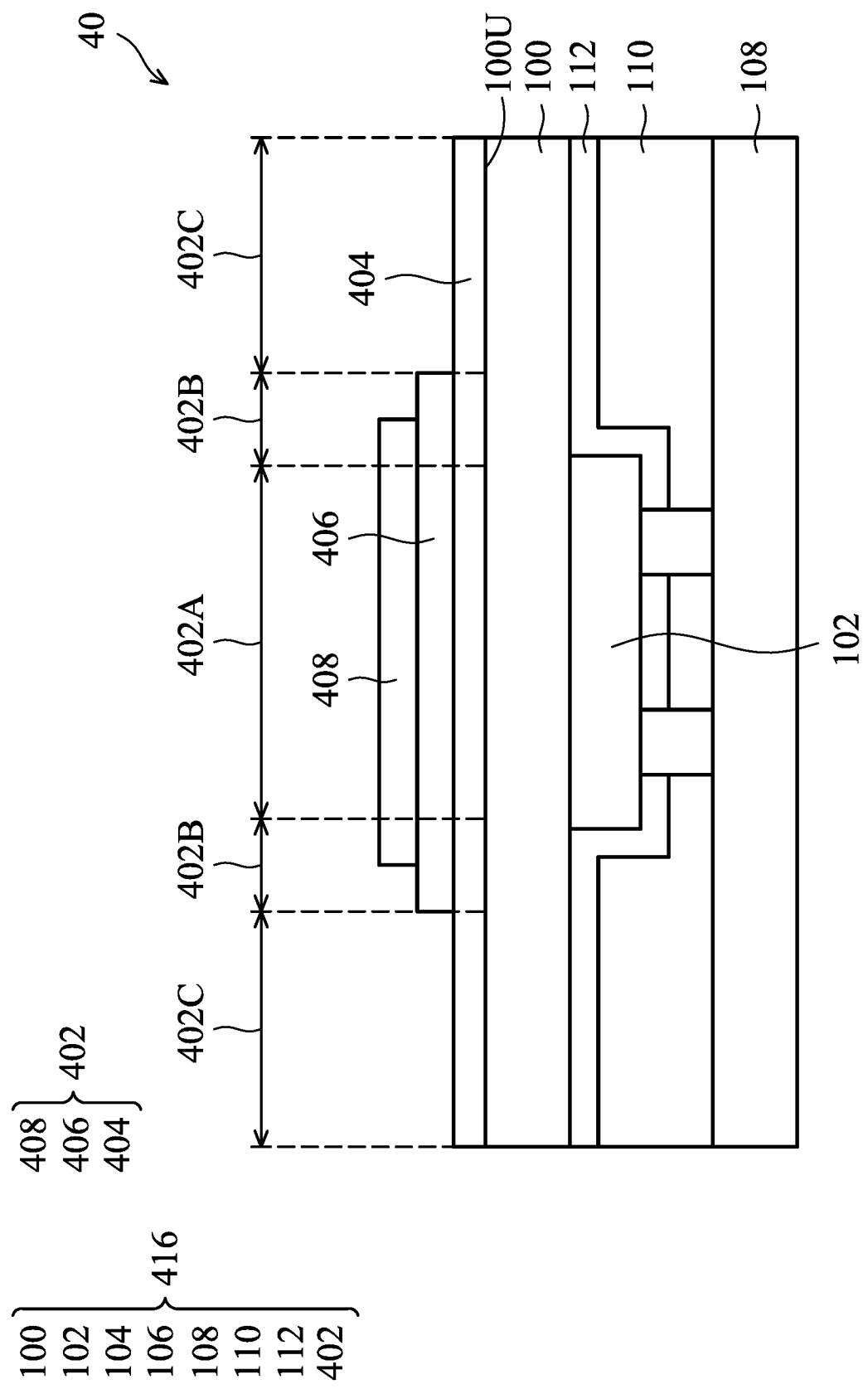
FIG. 4C is a partial cross-sectional view of the backlight unit 416 of the display device 40 according to some embodiments of the present disclosure.
Figure 4D:
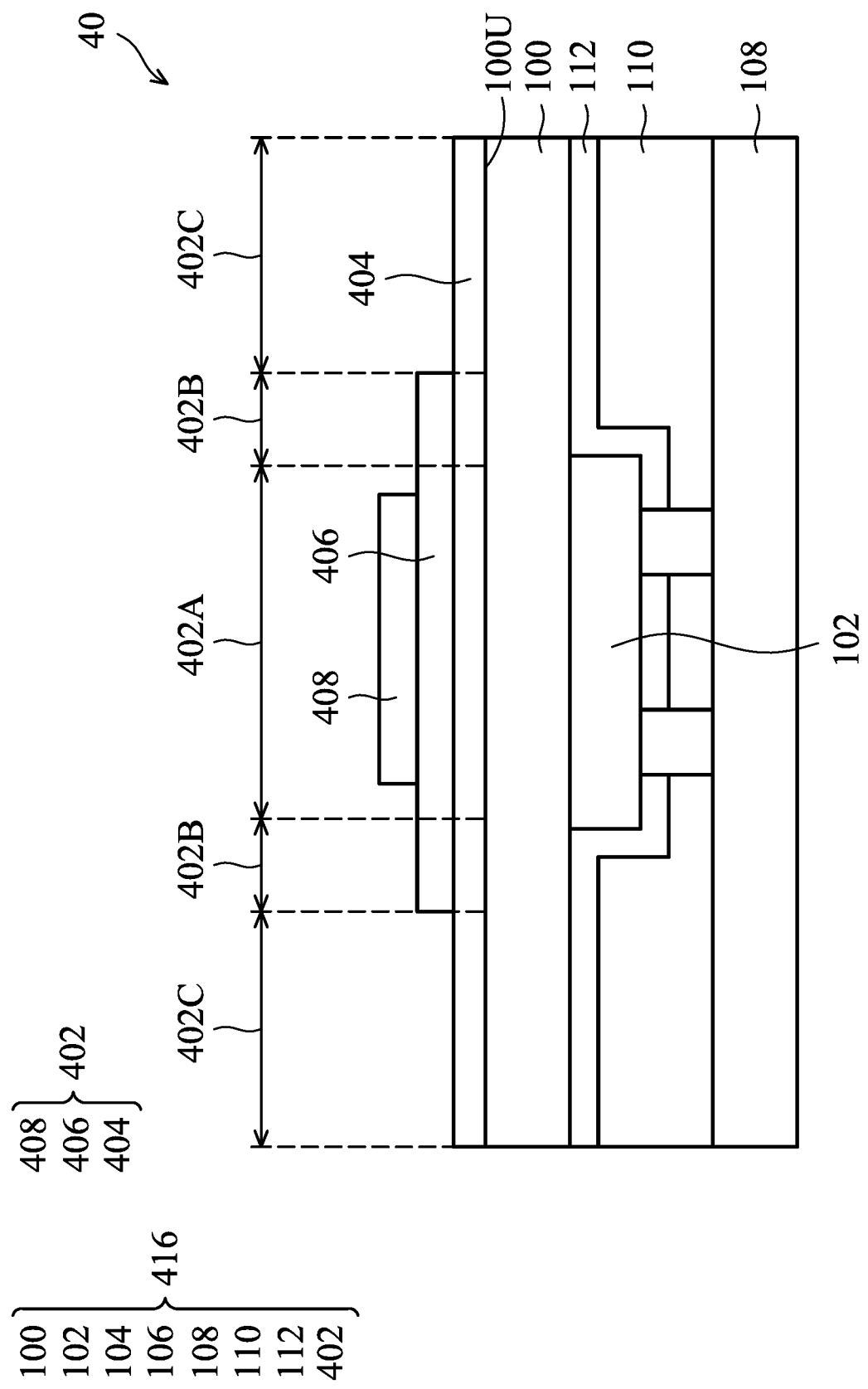
FIG. 4D is a partial cross-sectional view of the backlight unit 416 of the display device 40 according to some embodiments of the present disclosure.

It should be understood that in the embodiments illustrated in FIG. 4B, the third sub-layer 408 is disposed completely corresponding to the first patterned region 402A. However, in other embodiments, the third sub-layer 408 may extend beyond the first patterned region 402A (as shown in FIG. 4C), or the third sub-layer 408 may be smaller than the first patterned region 402A (as shown in FIG. 4D).

It should be understood that although the patterned layer including three patterned regions and three sub-layers is taken as an example in Embodiment 4, the present disclosure is not limited thereto. For example, other numbers of patterned regions and other numbers of sub-layers may be formed as needed.

It should be noted that although they are not shown in the figure, the display device 40 may also include a liquid crystal layer, a TFT substrate, a color filter substrate, or other applicable display elements as discussed above.

Embodiment 5

In Embodiment 5, the patterned layer of the backlight unit of the display device 50 includes grid patterns, and the dimensions of the openings of the grid patterns may be adjusted to improve the light uniformity of the light emitted by the backlight unit of the display device 50.

Figure 5:
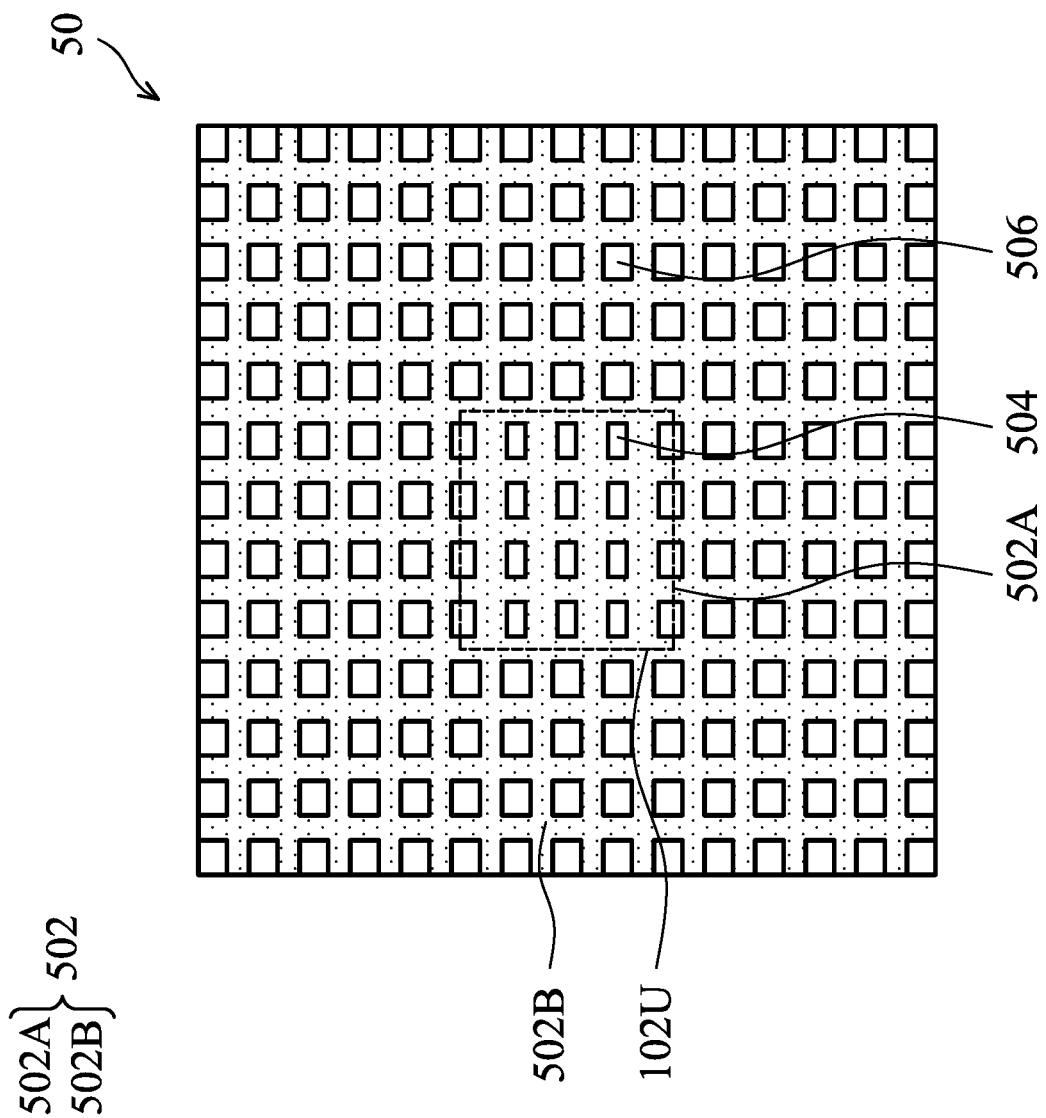
FIG. 5 illustrates a projection of the light-emitting unit and the patterned layer of the display device 50 onto the second upper surface of the first substrate according to Embodiment 5 of the present disclosure.

FIG. 5 illustrates the arrangement of the patterned layer 502 of the backlight unit of the display device 50. In detail, FIG. 5 is a projection view obtained by projecting the light-emitting surface of the light-emitting unit and the patterned layer onto the second upper surface 108U of the first substrate 108. For the interest of clarity, only the light-emitting unit 102 is illustrated as an example in FIG. 5. However, the arrangement may also be applied to other light-emitting units such as the light-emitting units 104 and 106.

As shown in FIG. 5, the patterned layer 502 may include grid patterns, and the patterned layer 502 may include a first patterned region 502A and a second patterned region 502B disposed around the first patterned region 502A. The first patterned region 502A is disposed corresponding to the light-emitting unit 102, and the second patterned region 502B is not disposed corresponding to any light-emitting units. In other words, a region obtained by projecting the first patterned region 502A onto the second upper surface 108U of the first substrate 108 overlaps a region obtained by projecting the light-emitting surface 102U of the light-emitting unit 102 onto the second upper surface 108U of the first substrate 108, and a region obtained by projecting the second patterned region 502B onto the second upper surface 108U of the first substrate 108 does not overlap regions obtained by projecting the light-emitting surfaces of any light-emitting units onto the second upper surface 108U of the first substrate 108.

As shown in FIG. 5, the first patterned region 502A may include a plurality of first openings 504, and the second patterned region 502B may include a plurality of second openings 506. In some embodiments, as shown in FIG. 5, a dimension (i.e., an area) of one of the first plurality of openings 504 may be less than a dimension of one of the second plurality of openings 506. Further, in some embodiments, the dimension of each of the first plurality of openings 504 is less than the dimension of each of the second plurality of openings 506 (i.e., the dimension of the largest one of the first plurality of openings 504 is less than the dimension of the smallest one of the second plurality of openings 506), and thus the light uniformity of the light emitted by the backlight unit of the display device 50 may be improved.

In some embodiments, the patterned layer may include a metal (e.g., Al or Ag), other applicable materials, or a combination thereof, and the step for forming the patterned layer 502 may include a deposition process (e.g., an evaporation process or a sputtering process), a lithography process (e.g., photoresist coating, soft baking, mask aligning, exposure, post-exposure, developing photoresist, rising, and drying), an etching process (e.g., a dry etching process or a wet etching process), other applicable processes, or a combination thereof.

In some embodiments, the first plurality of openings 504 and/or the second plurality of openings 506 may be filled with a material having low refractive index (e.g., a transparent material of which the refractive index is less than the refractive index of the mother substrate 100 for light-emitting units) by an applicable process (e.g., a spin-on coating process), and thus the light uniformity of the light emitted by the backlight unit of the display device 50 may be improved further. In some embodiments, the mother substrate 100 for light-emitting units is a sapphire substrate, and the refractive index of the transparent material having low refractive index is less than 2.4. For example, the transparent material having low refractive index may include polyimide, silicon, epoxy, transparent photoresist, other applicable transparent materials, or a combination thereof.

It should be understood that although the openings in the patterned layer of this embodiment are substantially rectangular, the present disclosure is not limited thereto. For example, the openings in the patterned layer may also be substantially circular, oblong, triangular, polygonal, irregular-shaped, other applicable shapes, or a combination thereof.

It should be noted that although they are not shown in the figure, the display device 50 may also include a liquid crystal layer, a TFT substrate, a color filter substrate, or other applicable display elements as discussed above.

Embodiment 6

In Embodiment 6, the patterned layer of the backlight unit 616 of the display device 60 includes a first patterned region and a plurality of patterned regions disposed around the first patterned region, and the refractive indexes of the plurality of patterned regions disposed around the first patterned region gradually increase in a direction away from the first patterned region, and thus the light uniformity of the light emitted by the backlight unit 616 of the display device 60 may be improved. For the interest of clarity, only the light-emitting unit 102 is illustrated as an example in FIGS. 6A-6B. However, the arrangement may also be applied to other light-emitting units such as the light-emitting units 104 and 106.

Figure 6A:
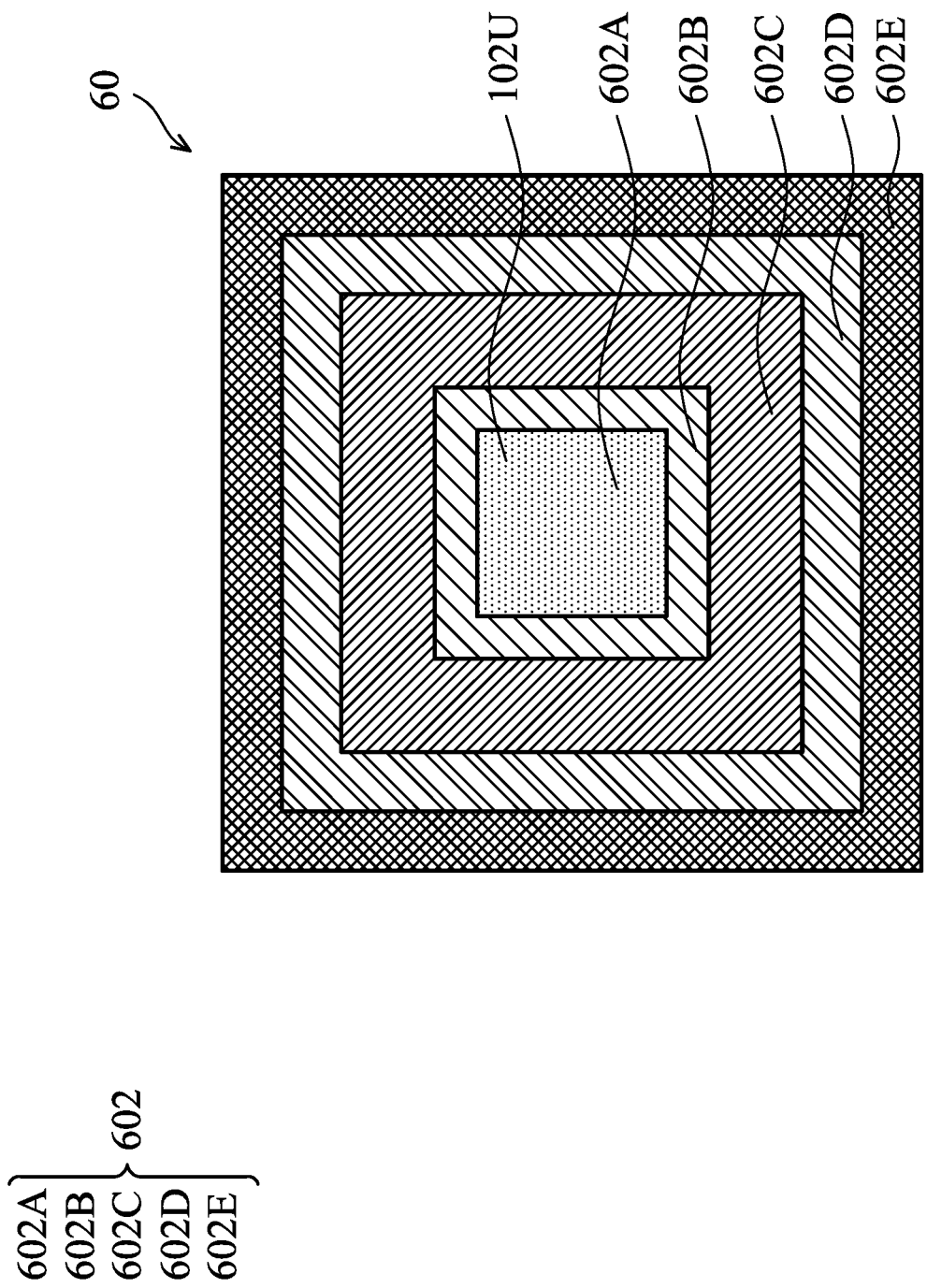
FIG. 6A illustrates a projection of the light-emitting unit and the patterned layer of the display device 60 onto the second upper surface of the first substrate according to Embodiment 6 of the present disclosure.

FIG. 6A illustrates the arrangement of the patterned layer 602 of the backlight unit 616 of the display device 60. In detail, FIG. 6A is a projection view obtained by projecting the light-emitting surface of the light-emitting unit and the patterned layer 602 onto the second upper surface 108U of the first substrate 108.

As shown in FIG. 6A, the patterned layer 602 may include a first patterned region 602A, and a plurality of patterned regions 602B, 602C, 602D, and 602E disposed around the first patterned region 602A. The first patterned region 602A is disposed corresponding to the light-emitting unit 102, and the plurality of patterned regions 602B, 602C, 602D, and 602E disposed around the first patterned region are not disposed corresponding to any light-emitting units. In other words, a region obtained by projecting the first patterned region 602A onto the second upper surface 108U of the first substrate 108 overlaps a region obtained by projecting the light-emitting surface 102U of the light-emitting unit 102 onto the second upper surface 108U of the first substrate 108, and regions obtained by projecting the plurality of patterned regions 602B, 602C, 602D, and 602E onto the second upper surface 108U of the first substrate 108 do not overlap regions obtained by projecting the light-emitting surfaces of any light-emitting units onto the second upper surface 108U of the first substrate 108.

Figure 6B:
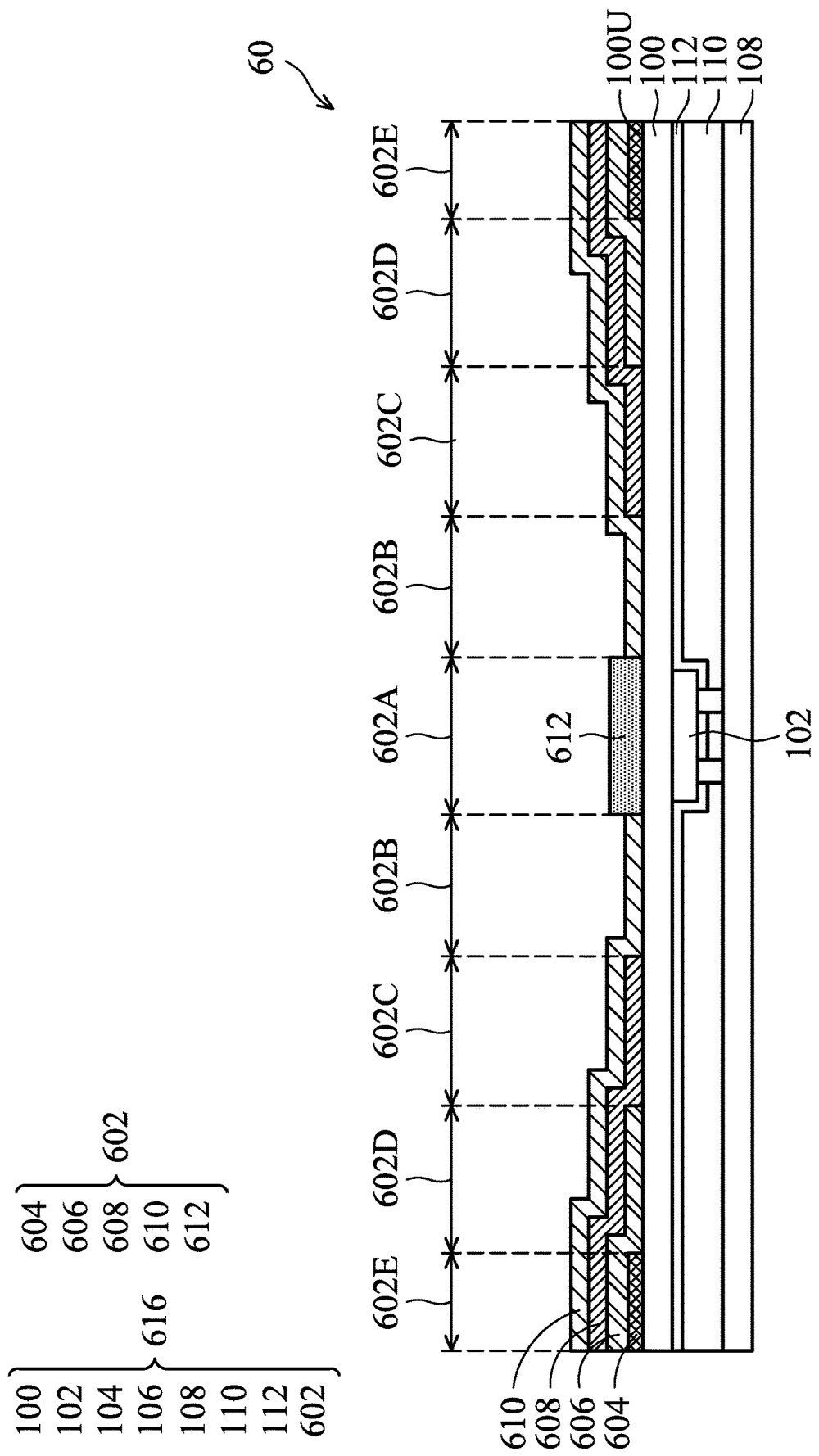
FIG. 6B is a partial cross-sectional view of the backlight unit 616 of the display device 60 according to Embodiment 6 of the present disclosure.

Referring to FIGS. 6A-6B, in some embodiments, each of the plurality of patterned regions 602B, 602C, 602D, and 602E has an effective refractive index equal to the refractive index of the first patterned region 602A, and the refractive index of the first sub-layer 604 of the patterned layer 602 is greater than the refractive index of the second sub-layer 606 of the patterned layer 602, the refractive index of the second sub-layer 606 of the patterned layer 602 is greater than the refractive index of the third sub-layer 608 of the patterned layer 602, the refractive index of the third sub-layer 608 of the patterned layer 602 is greater than the refractive index of the fourth sub-layer 610 of the patterned layer 602, so that the light uniformity of the light emitted by the backlight unit 616 of the display device 60 may be improved by the multi-layered structure and the refractive index matching.

FIG. 6B illustrates a partial cross-sectional view of the backlight unit 616 of the display device 60 of this embodiment. As shown in FIG. 6B, the patterned layer 602 may include a plurality of sub-layers. In some embodiments, as shown in FIG. 6B, the patterned layer 602 may include a first sub-layer 604, a second sub-layer 606, a third sub-layer 608, a fourth sub-layer 610, and a fifth sub-layer 612.

In some embodiments, the refractive index of the first sub-layer 604 is greater than the second sub-layer 606, the refractive index of the second sub-layer 606 is greater than the refractive index of the third sub-layer 608, and the refractive index of the third sub-layer 608 is greater than the refractive index of the fourth sub-layer 610, so that each of the plurality of patterned regions 602B (the patterned region 602B includes the fourth sub-layer 610), 602C (the patterned region 602C includes the stacked structure of the third sub-layer 608 and the fourth sub-layer 610), 602D (the patterned region 602D includes the stacked structure of the second sub-layer 606, the third sub-layer 608 and the fourth sub-layer 610), and 602E (the patterned region 602E includes the stacked structure of the first sub-layer 604, the second sub-layer 606, the third sub-layer 608 and the fourth sub-layer 610) has an effective refractive index equal to the refractive index of the first patterned region 602A.

As discussed above, in some embodiments, the patterned layer 602 may include a stacked structure, and the stacked structure may have a refractive index which decreases in a direction away from the first upper surface 100U of the mother substrate 100 for light-emitting units. For example, the patterned region 602C of the patterned layer 602 includes the third sub-layer 608 on the first upper surface 100U of the mother substrate 100 for light-emitting units, and the fourth sub-layer 610 on the third sub-layer 608, and the refractive index of the fourth sub-layer 610 is less than the refractive index of the third sub-layer 608.

In some embodiments, as shown in FIG. 6B, the thicknesses (e.g., minimum thicknesses) of the plurality of patterned regions 602B, 602C, 602D, and 602E disposed around the first patterned region 602A may gradually increase in a direction away from the first patterned region 602A (i.e., the thickness of the patterned region 602E>the thickness of the patterned region 602D>the thickness of the patterned region 602C>the thickness of the patterned region 602B).

For example, the first sub-layer 604 may include silicon, epoxy, indium tin oxide (ITO), titanium oxide ($TiO_x$), silicon oxide ($SiO_x$), silicon nitride (SiNx), other applicable materials, or a combination thereof, the second sub-layer 606 may include silicon, epoxy, indium tin oxide (ITO), titanium oxide ($TiO_x$), silicon oxide ($SiO_x$), silicon nitride (SiNx), other applicable materials, or a combination thereof, the third sub-layer 608 may include silicon, epoxy, indium tin oxide (ITO), titanium oxide ($TiO_x$), silicon oxide ($SiO_x$), silicon nitride (SiNx), other applicable materials, or a combination thereof, and the fourth sub-layer 610 may include silicon, epoxy, indium tin oxide (ITO), titanium oxide ($TiO_x$), silicon oxide ($SiO_x$), silicon nitride (SiNx), other applicable materials, or a combination thereof.

In some embodiments, the fifth sub-layer 612 may include a metal (e.g., Al, Ag, other applicable metals, or a combination thereof) or distributed Bragg reflector structure, and thus the refractive index of the first patterned region 602A to which the fifth sub-layer 612 corresponds may be greater than the refractive indexes of the plurality of patterned regions 602B, 602C, 602D, and 602E disposed around the first patterned region 602A, forming a structure with a gradual change of the refractive index, so as to further improve the light uniformity of the light emitted by the backlight unit 616 of the display device 60.

It should be understood that although the patterned layer including five patterned regions and five sub-layers is taken as an example in Embodiment 6, the present disclosure is not limited thereto. For example, other numbers of patterned regions and other numbers of sub-layers may be formed as needed.

It should be noted that although they are not shown in the figure, the display device 60 may also include a liquid crystal layer, a TFT substrate, a color filter substrate, or other applicable display elements as discussed above.

In summary, the display device of the embodiments of the present disclosure uses the mother substrate for the light-emitting units to serve as the light guide plate. Therefore, no additional light guide plate is needed, and thus the thickness of the display device may be reduced. In addition, a patterned layer may be disposed on the mother substrate for the light-emitting units to increase the light uniformity of the light emitted by the backlight unit of the display device.

It should be understood that in addition to being combined with other applicable display elements to form a display device, the backlight unit of the embodiments of the present disclosure may also be used as a plane light source alone and be applied to general lighting products (e.g., a panel light).

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure. In addition, each claim can be an individual embodiment of the present disclosure, and the scope of the present disclosure includes the combinations of every claim and every embodiment of the present disclosure.

What is claimed is:

1. A display device, comprising:
a mother substrate for light-emitting units, wherein the mother substrate for light-emitting units has a first upper surface and a first lower surface, and wherein at least one light-emitting unit is disposed on the first lower surface;
a first substrate having a second upper surface, a second lower surface, and a plurality of active devices disposed between the second upper surface and the second lower surface, wherein the at least one light-emitting unit is electrically connected with at least one of the active devices of the first substrate;
a patterned layer disposed on the first upper surface of the mother substrate for light-emitting units, and comprising a first patterned region and a second patterned region around the first patterned region, wherein a region projected on the second upper surface of the first substrate by the first patterned region overlaps a region projected on the second upper surface of the first substrate by a light-emitting surface of the at least one light-emitting unit, a region projected on the second upper surface of the first substrate by the second patterned region does not overlap the region projected on the second upper surface of the first substrate by the light-emitting surface of the at least one light-emitting unit, and light transmittance of the first patterned region is different from light transmittance of the second patterned region, and wherein the first patterned region comprises a plurality of first patterns, the second patterned region comprises a plurality of second patterns, and an area of one of the plurality of first patterns is greater than an area of one of the plurality of second patterns.

2. The display device as claimed in claim 1, further comprising:
a first insulating layer disposed between the mother substrate for light-emitting units and the first substrate, wherein the first insulating layer is disposed around the at least one light-emitting unit.

3. The display device as claimed in claim 1, wherein the mother substrate for light-emitting units is a sapphire substrate, and the at least one light-emitting unit is formed on the sapphire substrate through an epitaxial process.

4. The display device as claimed in claim 1, further comprising:
a wavelength conversion layer disposed on the first upper surface of the mother substrate for light-emitting units.

5. The display device as claimed in claim 1, further comprising:
a reflection layer disposed on the first lower surface of the mother substrate for light-emitting units.

6. The display device as claimed in claim 1, wherein the light transmittance of the second patterned region is greater than the light transmittance of the first patterned region.

7. The display device as claimed in claim 1, wherein the first patterned region comprises aluminum, silver, or a combination thereof.

8. The display device as claimed in claim 1, wherein the first patterned region comprises a distributed Bragg reflector structure.

9. The display device as claimed in claim 1, wherein the patterned layer further comprises a third patterned region around the second patterned region, wherein a region projected on the second upper surface of the first substrate by the third patterned region does not overlap the region projected on the second upper surface of the first substrate by the light-emitting surface of the at least one light-emitting unit, and wherein light transmittance of the first patterned region, light transmittance of the second patterned region, and light transmittance of the third patterned region are different from each other.

10. The display device as claimed in claim 9, wherein the light transmittance of the first patterned region is less than the light transmittance of the second patterned region, and the light transmittance of the second patterned region is less than the light transmittance of the third patterned region.

11. The display device as claimed in claim 9, wherein a thickness of the first patterned region of the patterned layer is greater than a thickness of the second patterned region of the patterned layer, and the thickness of the second patterned region of the patterned layer is greater than a thickness of the third patterned region of the patterned layer.

12. The display device as claimed in claim 1, wherein the patterned layer has a plurality of openings therein, wherein when the openings and the at least one light-emitting unit are projected on the second upper surface of the first substrate, an area of one of the openings overlapping a light-emitting surface of the at least one light-emitting unit is less than an area of one of the openings not overlapping the light-emitting surface of the at least one light-emitting unit.

13. The display device as claimed in claim 1, wherein the patterned layer comprises a plurality of patterned regions around the first patterned region, wherein regions projected on the second upper surface of the first substrate by the plurality of patterned regions around the first patterned region do not overlap the region projected on the second upper surface of the first substrate by the light-emitting surface of the at least one light-emitting unit, and wherein an effective refractive index of each of the plurality of patterned regions around the first patterned region is equal to a refractive index of the first patterned region.

14. The display device as claimed in claim 13, wherein thicknesses of the plurality of patterned regions around the first patterned region of the patterned layer increase in a direction away from the first patterned region.

15. The display device as claimed in claim 13, wherein the plurality of patterned regions around the first patterned region comprise a stacked structure, and the stacked structure has a refractive index which decreases in a direction away from the first upper surface of the mother substrate for light-emitting units.

16. The display device as claimed in claim 1, wherein the at least one of light-emitting units comprises a red light-emitting unit, a green light-emitting unit, and a blue light-emitting unit.

17. The display device as claimed in claim 1, wherein the active device of the first substrate electrically connected with the at least one light-emitting unit controls a current signal transmitted to the at least one light-emitting unit, so as to adjust a brightness of the at least one light-emitting unit.

* * * * *